United States Patent [19]
Suga

[11] Patent Number: 6,115,304
[45] Date of Patent: Sep. 5, 2000

[54] SEMICONDUCTOR MEMORY DEVICE AND METHOD OF BURN-IN TESTING

[75] Inventor: Koichiro Suga, Kanagawa, Japan

[73] Assignee: NEC Corporation, Tokyo, Japan

[21] Appl. No.: 09/314,626

[22] Filed: May 19, 1999

[30]      Foreign Application Priority Data

May 19, 1998  [JP]  Japan ................................ 10-136891

[51] Int. Cl.[7] ........................................................ G11C 7/00
[52] U.S. Cl. ............................ 365/201; 365/189.05; 365/194
[58] Field of Search ........................................ 365/201, 194, 365/189.05, 230.08

[56]              References Cited

U.S. PATENT DOCUMENTS

| | | | |
|---|---|---|---|
| 5,471,429 | 11/1995 | Lee et al. ................................ | 365/201 |
| 5,638,331 | 6/1997 | Cha et al. ................................ | 365/201 |
| 5,680,362 | 10/1997 | Parris et al. ............................. | 365/201 |
| 5,802,001 | 9/1998 | Kim ......................................... | 365/201 |
| 5,949,724 | 9/1999 | Kang et al. .............................. | 365/201 |

Primary Examiner—Son T. Dinh
Attorney, Agent, or Firm—McGinn & Gibbs, P.C.

[57]              ABSTRACT

A write circuit outputs a write con and to a memory cell in response to a data input signal. A decoder decodes an address input signal and outputs an address command to the memory cell. A counter outputs a signal to the decoder, the signal delaying decode timing in response to a control signal inputted at the time of a burn-in test. Therefore, the counter cancel a late write cycle by delaying an operation cycle of the decode timing against an operation cycle of a write command signal from the write circuit that is transmitted to the memory cell.

8 Claims, 7 Drawing Sheets

SEMICONDUCTOR MEMORY DEVICE AND METHOD OF BURN-IN TESTING

BACKGROUND OF THE INVENTION

1. Field of the Invention

The present invention relates to a semiconductor memory device and a method of burn-in testing for performing a test on reliability items for the semiconductor memory device.

2. Description of the Related Art

A burn-in test (hereinafter, BT) is performed for a semiconductor memory device so as to enhance the reliability of the semiconductor memory device.

Recently, as the capacity and the like of semiconductor memory device increases, a rate of test time on reliability items becomes high to overall processing time. Therefore, reduction of BT time is desired.

A conventional semiconductor memory device comprises a plurality of registers, a decision circuit, counters, decoders, a write circuit, a memory cell, and an SA circuit.

By inputting a CLK signal and a first control signal A to a first register, a second control signal B to a second register, a data input signal DIN to a third register, and an address signal to a fourth register and a counter respectively, and outputting a data output signal DOUT of the semiconductor memory device from a fifth register, the BT is performed.

When performing burst operation with making I/O terminals of a semiconductor memory device common, if the semiconductor memory device is controlled with an input signal that is the same as that in ordinary operation, a late write cycle becomes necessary lest a necessary data output signal DOUT and a data input signal DIN should exist simultaneously if write operation is performed after read operation at the time of the ordinary operation. Therefore, this method has a problem that BT time becomes longer.

Conventionally, it is common to perform a BT in only the write operation, in which a differential potential given to a memory cell constructing a semiconductor memory device is high, so as to cast a large stress to the memory cell. Therefore, if only the write operation is continuously performed, the BT time is reduced by omitting the unnecessary late write cycle at the time of performing the BT.

SUMMARY OF THE INVENTION

An object of the present invention is to provide a semiconductor memory device and a method of burn-in testing, the method easily reducing of BT time by controlling internal circuit operation of a semiconductor memory device which is synchronous type and which has only the burst operation, only at the time of performing the BT test.

A semiconductor memory device of the present invention comprises a write circuit, a decoder, a control unit, and a memory cell. A data input signal is inputted to the memory cell. A data output signal is output from the memory cell. The write circuit outputs a write command to the memory cell in response to the data input signal. The decoder decodes an address input signal, and outputs an address command to the memory cell. The control unit outputs a signal, which delays decode timing in response to a control signal inputted at the time of performing a burn-in test, to the decoder.

The control unit has a function of delaying an operation cycle of the decode timing by one cycle to an operation cycle of a write co—and signal transmitted from the write circuit to the memory cell.

Furthermore, the control unit has a function of latching a next burst start signal into the decoder in response to a control signal forcibly inputted when write operation to the memory cell by the data input signal is completed.

In addition, a method of burn-in testing of the present invention comprises a step of inputting a data input signal to a memory cell, a step of outputting a data output signal from the memory cell, a step of forcibly inputting a control signal, and a step of delaying an operation cycle of the decode timing by one cycle to an operation cycle of a write command signal transmitted from the write circuit to the memory cell.

Furthermore, a method of burn-in testing of the present invention comprises a step of delaying an operation cycle of the decode timing by one cycle to an operation cycle of a write command signal from the write circuit that is transmitted to the memory cell.

Moreover, a method of burn-in testing of the present invention comprises a step of inputting a data input signal to a memory cell, a step of outputting a data output signal from the memory cell, a step of latching a next burst start signal in response to a control signal forcibly inputted when write operation to the memory cell by the data input signal is completed, and a step of precharging a digit line of the memory cell during write operation to the memory cell.

In addition, a method of burn-in testing of the present invention comprises a step of inputting a data input signal to a memory cell, a step of outputting a data output signal from the memory cell, a step of forcibly inputting a control signal, a step of delaying an operation cycle of the decode timing by one cycle to an operation cycle of a write command signal transmitted from the write circuit to the memory cell, a step of latching a next burst start signal in response to a control signal forcibly inputted when write operation to the memory cell by the data input signal is completed, and a step of precharging a digit line of the memory cell during write operation to the memory cell.

DESCRIPTION OF THE PREFERRED EMBODIMENTS

Figure 1:
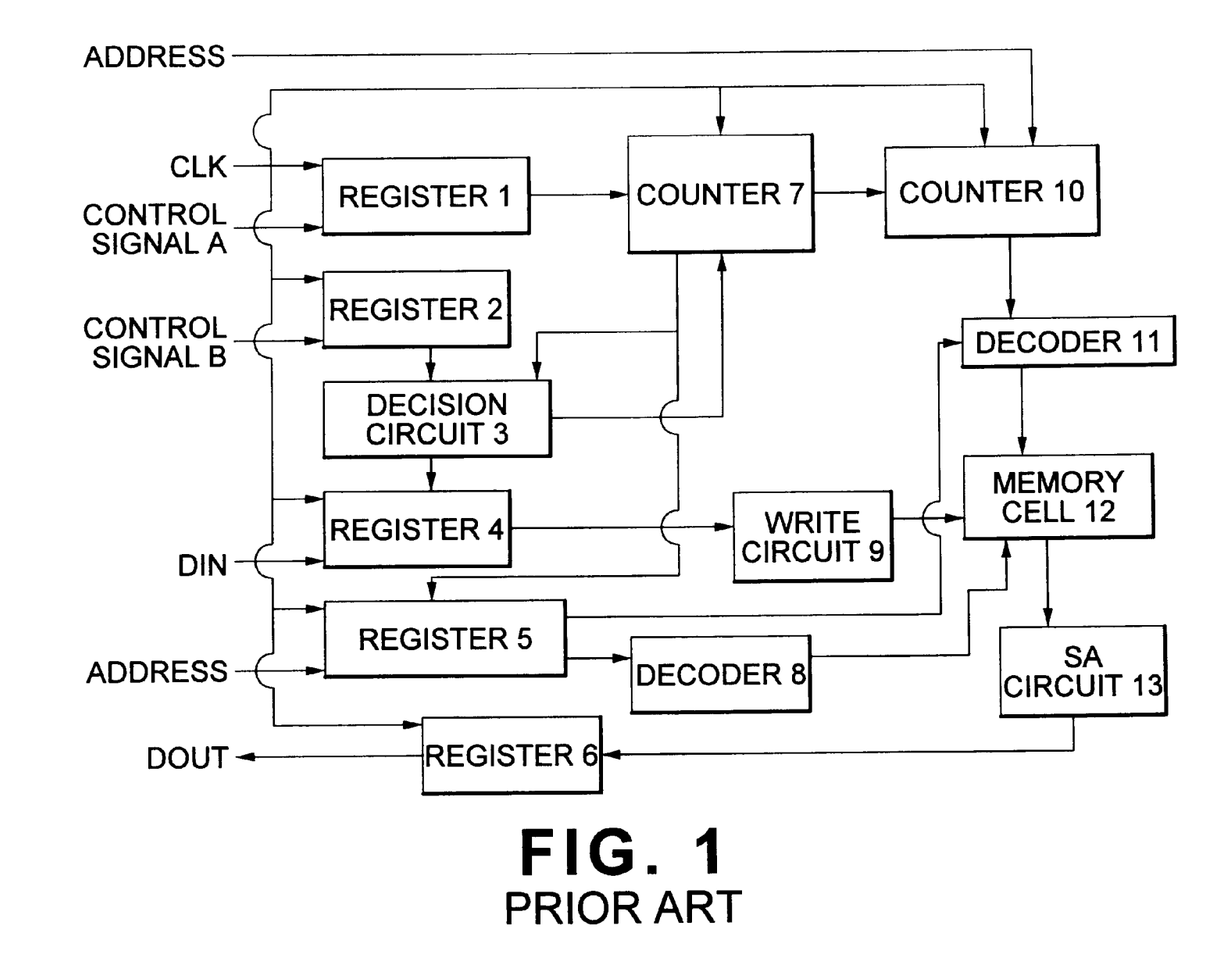
FIG. 1 is a block diagram showing a synchronous SRAM semiconductor memory device according to a conventional example.

FIG. 1 is a block diagram showing the structure of a conventional semiconductor memory device that is an object for which a BT is performed. The semiconductor memory device shown in FIG. 1 comprises registers 1, 2, 4, 5, and 6, a decision circuit 3, counters 7 and 10, decoders 8 and 11, a write circuit 9, a memory cell 12, and a SA circuit 13.

In the semiconductor memory device shown in FIG. 1, by inputting a CLK signal and a control signal A to a register 1, a control signal B to a register 2, a data input signal DIN to a register 4, and an address signal to a register 5 and a counter 10 respectively, and outputting a data output signal DOUT of the semiconductor memory device from a register 6, the BT is performed.

Figure 2:
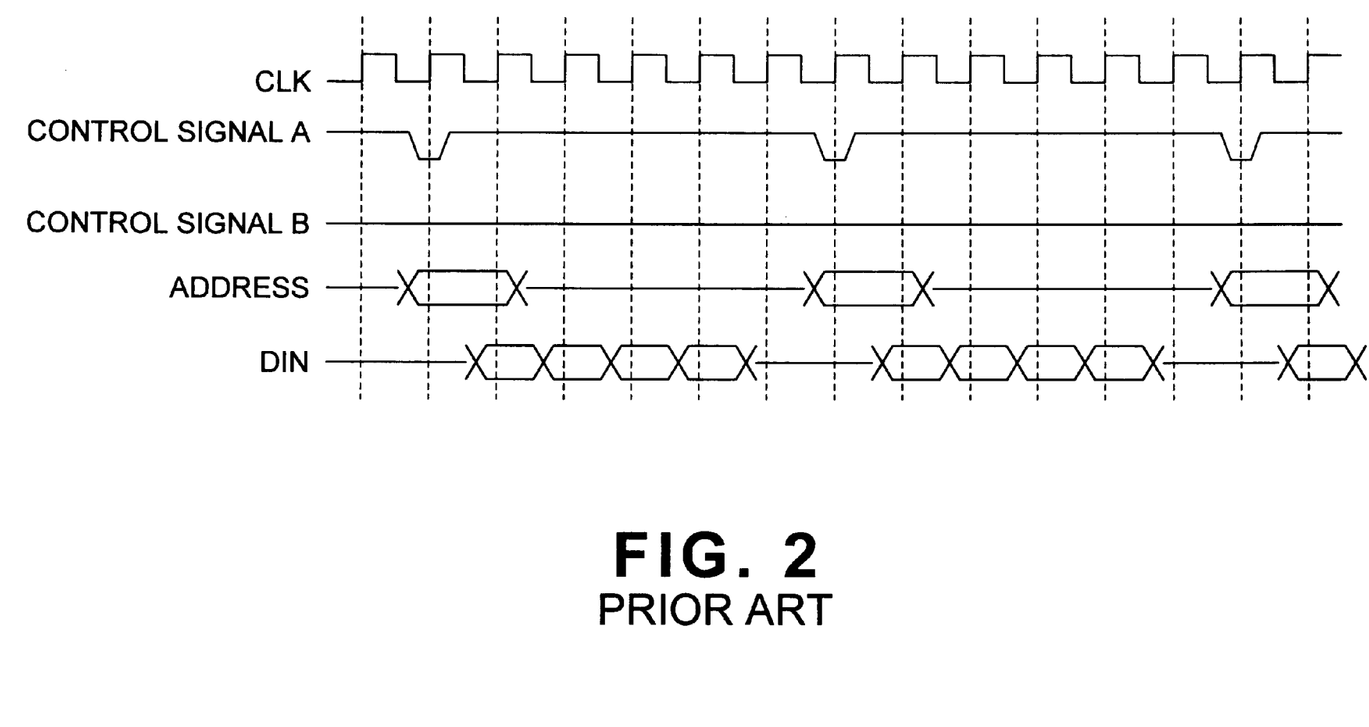
FIG. 2 is a chart for explaining operation at the time when a method of burn-in testing according to the conventional example is performed for the synchronous SRAM semiconductor memory device.

In FIG. 2, six-cycle write operation is continuously performed. It is because a conventional counter 7 shown in FIG. 6 has such structure that it is enabled to input a next burst start signal to the counter 10 only after the six-cycle write operation is competed if data in a write state is inputted from the decision circuit 3. Contents of the six-cycle write operation is a late write cycle (one cycle), an input cycle of the data input signal DIN (4 cycles), and a digit line precharge cycle after write that is unique in the SRAM memory cell 12 (one cycle).

Figure 3:
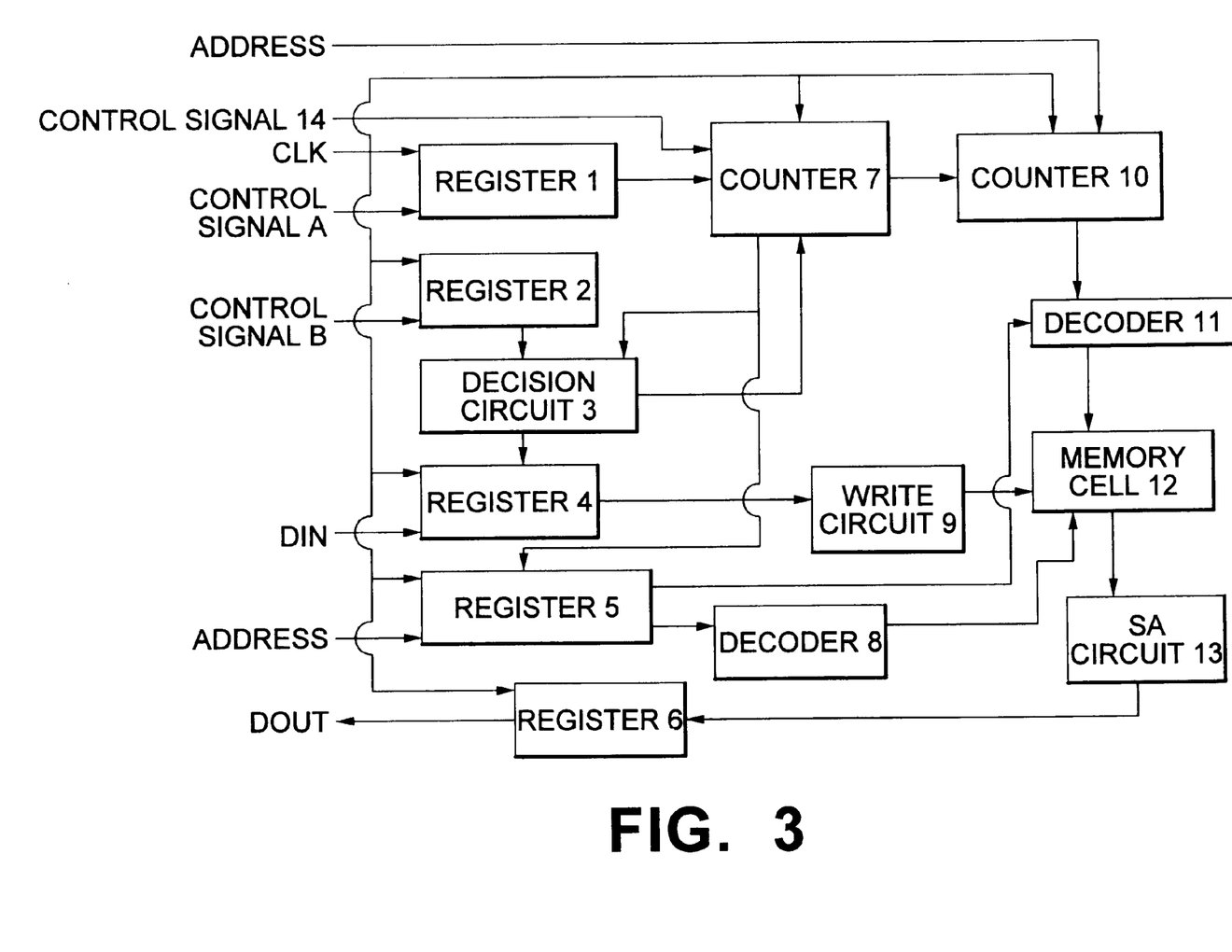
FIG. 3 is a block diagram showing a semiconductor memory device at the time when a method of burn-in testing according to a first embodiment of the present invention is performed.

Hereinafter, embodiments of the present invention will be described. FIG. 3 is a block diagram showing a semiconductor memory device of the present invention. In FIG. 3, the semiconductor memory device according to the present invention comprises write circuit 4 and 9, the decoder 8 and 11 and control unit 7. The data input signal DIN is inputted to the memory cell 12. The data output signal DOUT is outputted from the memory cell 12, The write circuit 4 and 9 outputs a write command to the memory cell 12 in response to the data input signal DIN, and the decoder 8 and 11 outputs an address command to the memory cell 12 after decoding an address input signal. Furthermore, control unit 7 outputs a signal, delaying decode timing, to the decoder 5 and 10 in response to a control signal 14 inputted at the time of performing the BT.

In the present invention, the operation cycle of the decode timing is delayed to the operation cycle of a signal in which the write command of the write circuit 4 and 9 is transmitted to the memory cell 12. To be concrete, by the signal being delayed by one cycle, the late write cycle is omitted.

Furthermore, in the present invention, when the write operation to the memory cell 12 by the data input signal is completed, a next burst start signal is latched in response to the control signal 14 forcibly inputted, and the digit line of the memory cell 12 is precharged during the write operation. Owing to this, the precharge cycle is omitted.

Moreover, the present invention can have also such construction that the control signal 14 is forcibly inputted, the operation cycle of the decode timing by the decoder is delayed to the operation cycle of a signal, in which the write command of the write circuit is transmitted to the memory cell, in response to the control signal 14, a next burst start signal is latched in response to the control signal 14, forcibly inputted, when the write operation to the memory cell by the data input signal is completed, and the digit line of the memory cell is precharged during the write operation.

Next, the first embodiment of the present invention described above will be further concretely described with reference to FIG. 3. As shown in FIG. 3, a semiconductor memory device at the time of performing the Br method comprises registers 1, 2, 4, 5, and 6, a decision circuit 3, counters 7 and 10, decoders 8 and 11, a write circuit 9, a memory cell 12, and a sense amplifier (SA) circuit 13. An input terminal for the control signal 14 is provided in the counter 7. Only at the time of performing the BT, the control signal 14 is inputted to the counter 7.

Note that the operation cycle of the address signal transmitted from the register 5, which latches the address input signal, and the burst counter 10, which latches the address input signal, to the memory cell 12 through the decoder 11 is earlier by one cycle than the operation cycle of a signal transmitted from the register 4, which latches the data input signal DIN, to memory cell 12 through the write circuit 9. First, the control signal 14 is latched in the counter 7. Next, a signal delaying the decode timing is inputted to the register 5 and burst counter 10. The burst counter 10 delays the decode timing of the decoder 11 by one cycle. Owing to this, omission of the late write cycle is realized.

By a CLK signal being inputted to the register 1, a control signal A is latched into the register 1, a control signal B is to the register 2, the data input signal DIN is to the register 4, and the address signal is to the register 5 and counter 10 respectively.

The output data of the register 1 is inputted to the counter 7. The counter 7 decides a state of burst operation. A decision signal from the counter 7 is outputted to the counter 10, decision circuit 3, and register 5.

The decision circuit 3 decides in response to data from the counter 7 which of the write and read operation it is. A decision signal thereof is outputted to the counter 7 and register 4.

The register 4 inputs the data input signal DIN to the write circuit 9 only when the decision signal from the decision circuit 3 shows the write state.

The register 5 outputs the address signal to the burst start decoder 8 and decoder 11 in response to an output signal of the counter 7. The decoders 8 and 11 write data at an address of the memory cell 12 in response to the address signal.

In case of a read state, data in the memory cell 12 corresponding to an address decided by the decoders 8 and 11 similarly to the above is amplified by the sense amplifier 13. The signal amplified is outputted from the register 6 as the data output signal DOUT.

Figure 4:
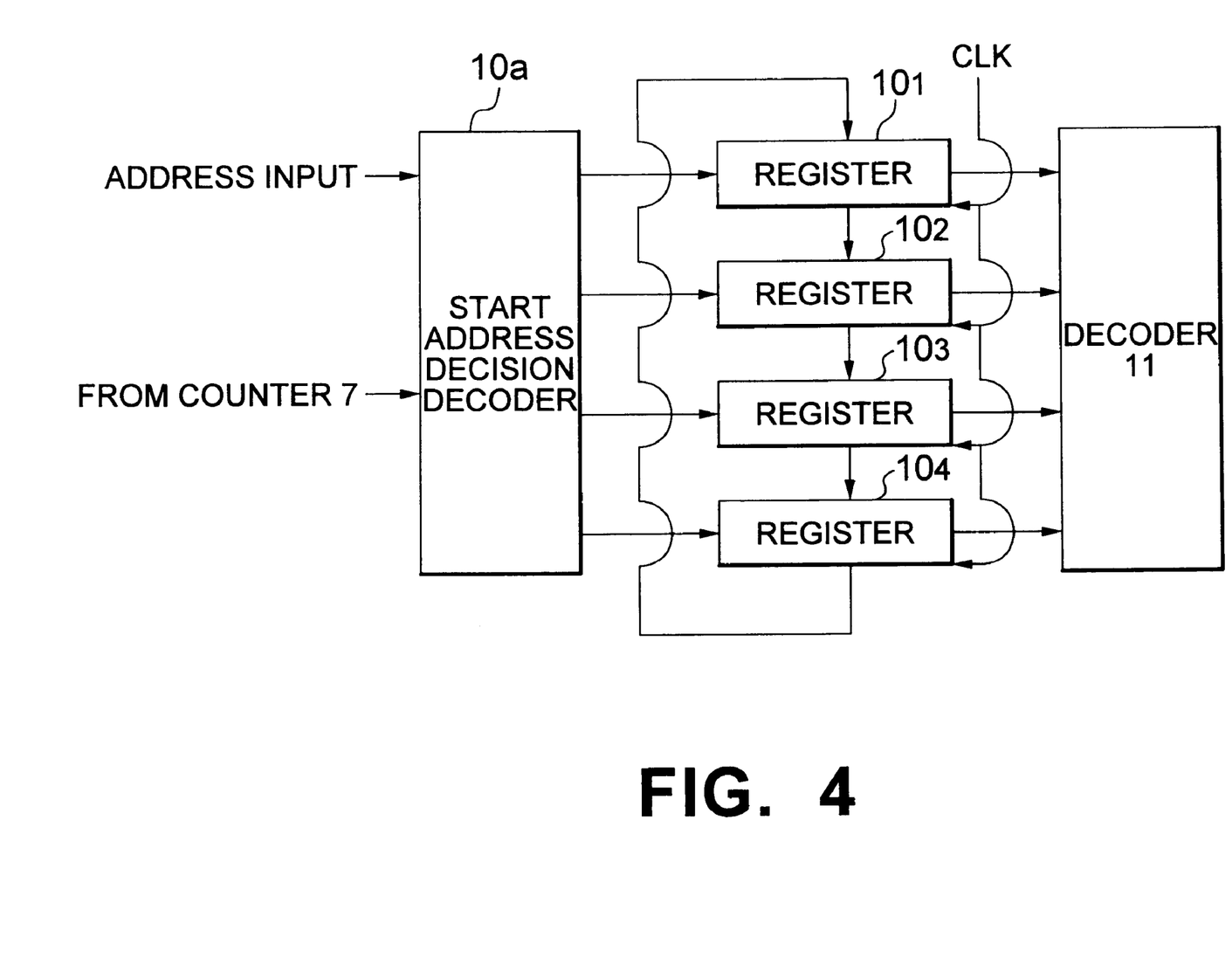
FIG. 4 is a diagram showing the concrete structure of the counter 10 shown in FIG. 1.

FIG. 4 is a block diagram showing the concrete structure of the counter 10 shown in FIG. 3. As shown in FIG. 4, the counter 10 comprises a decoder 10a, registers 101, 102, 103, and 104.

First, the decoder 10a that decides a burst start address in response to the address input signal and the output signal from the counter 7 is selected. A selection signal from the decoder 10a is inputted to the registers 101, 102, 103, and 104.

For example, if the selection signal from the decoder 10a is inputted to the register 101 and the signal outputted from the register 101 is outputted to the decoder 11, a register that is selected each time when the CLK signal is inputted is sequentially switched in the order of the register 102, register 103, and register 104.

Similarly, if the selection signal is inputted to the register 102 and non-selection signals are inputted to other registers 101, 103, and 104, a register that is selected each time when the CLK signal is inputted is sequentially switched in the order of the register 102, register 103, register 104, and register 101.

Even if the register 103 or 104 is first selected, the register to be selected is sequentially switched similarly to the above, and a selected address is decided.

Next, such a case that the method of burn-in testing is performed with using the semiconductor memory device shown in FIGS. 3 and 4 will be described with reference to FIG. 5.

Figure 5:
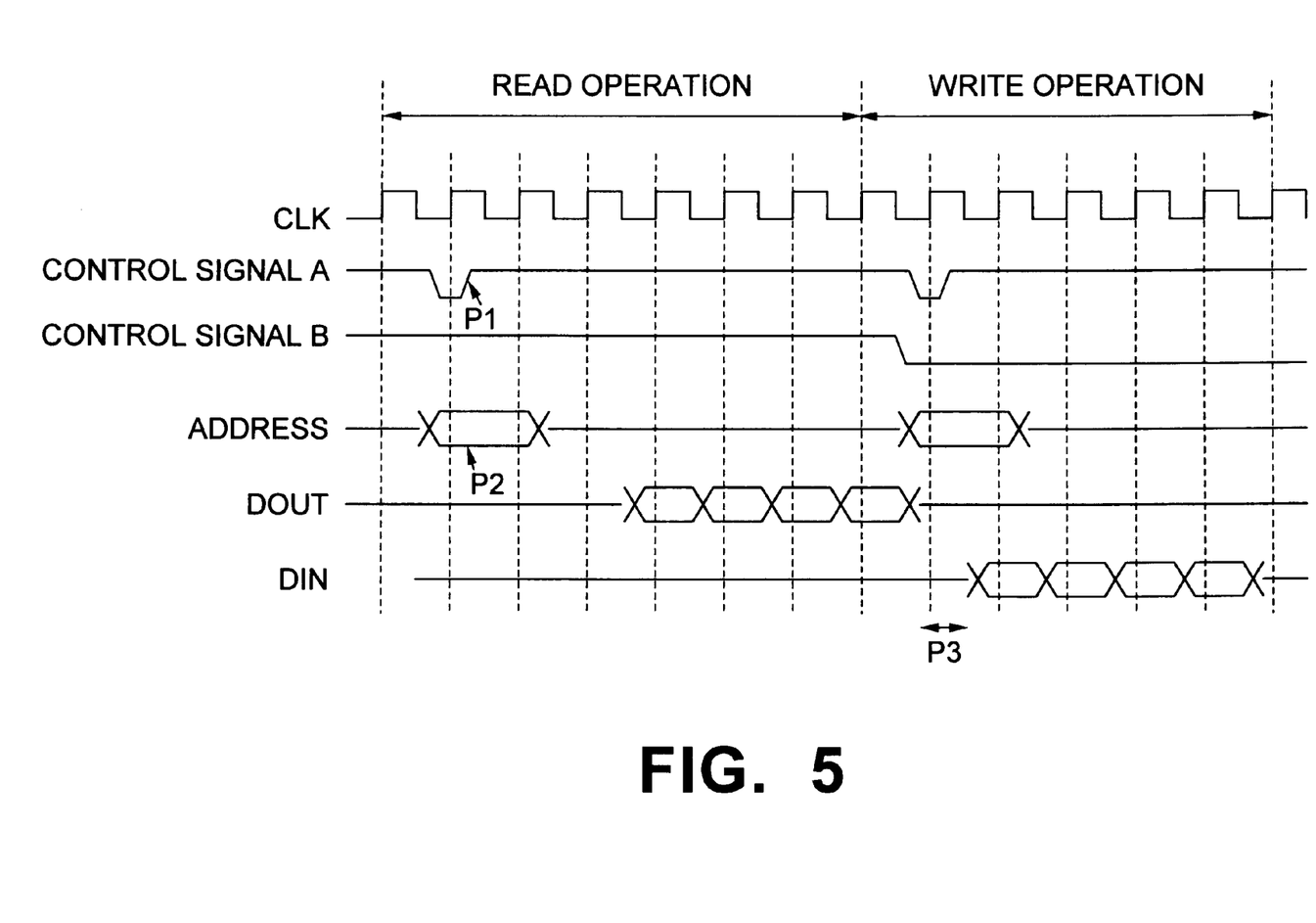
FIG. 5 is a chart for explaining operation at the time when the method of burn-in testing according to the first embodiment of the present invention is performed for a synchronous SRAM semiconductor memory device.

FIG. 5 shows a synchronous SRAM semiconductor memory device. Write operation after read operation, which is ordinary operation in which burst length is four, at the time of performing the method of burn-in testing according to the present invention with using the semiconductor memory device whose I/O terminals are made to be common will be described with paying attention to the representative input signal CLK, control signal A, control signal B, address signal, data input signal DIN, and data output signal DOUT.

In the synchronous SRAM semiconductor memory device shown in FIG. 3, all the signals inputted are latched at the point when the CLK signal transfers from LOW to HIGH. An internal circuit in FIG. 3 that is controlled in response to the CLK signal latches data and outputs data according to the input of the CLK signal.

If the control signal A is set to become ACTIVE when its level is LOW, burst operation starts at the point P1 (refer to FIG. 5) when the control signal A is LOW and the CLK signal transfers from LOW to HIGH.

In addition, a first address where the burst operation is performed is decided with an address signal latched at the point P2 (refer to FIG. 5).

After that, each of addresses for residual burst length (corresponding to three cycles) is decided each time when a cycle proceeds by one cycle in the counter 10.

In addition, the control signal B is a signal deciding which of the read operation and write operation it is. In FIG. 5, if the control signal S is SIGH, the read operation is performed, and if LOW, the write operation is performed.

If I/O terminals are set to be common and the write operation is performed after the read operation, a terminal, to which the data input signal DIN is inputted, and a terminal, from which the data output signal DOUT is outputted, are commonly used. Therefore, when the write operation is switched, the late write operation becomes necessary as shown in a period P3 in FIG. 5 lest the data output signal DOUT, which is outputted from the register 6, and the data input signal DIN, which is inputted to the register 4, should he intermixed.

In a cycle of the read operation, an address is decided only with the address signal inputted to the register 5. The data output signal DOUT from the memory cell 12 that corresponds to the address decided by the register 5 is outputted from the register 6. In a cycle of an ordinary write operation, the late write operation (refer to P3 in FIG. 5) becomes necessary.

Then, note that the operation cycle of the address signal from the register 5, which latches the address signal, and the burst counter 10 through the decoder 11 to the memory cell 12 is earlier by one cycle than the operation cycle of a signal from the register 4, which latches the data input signal DIN, through the write circuit 9 to the memory cell 12.

Figure 6:
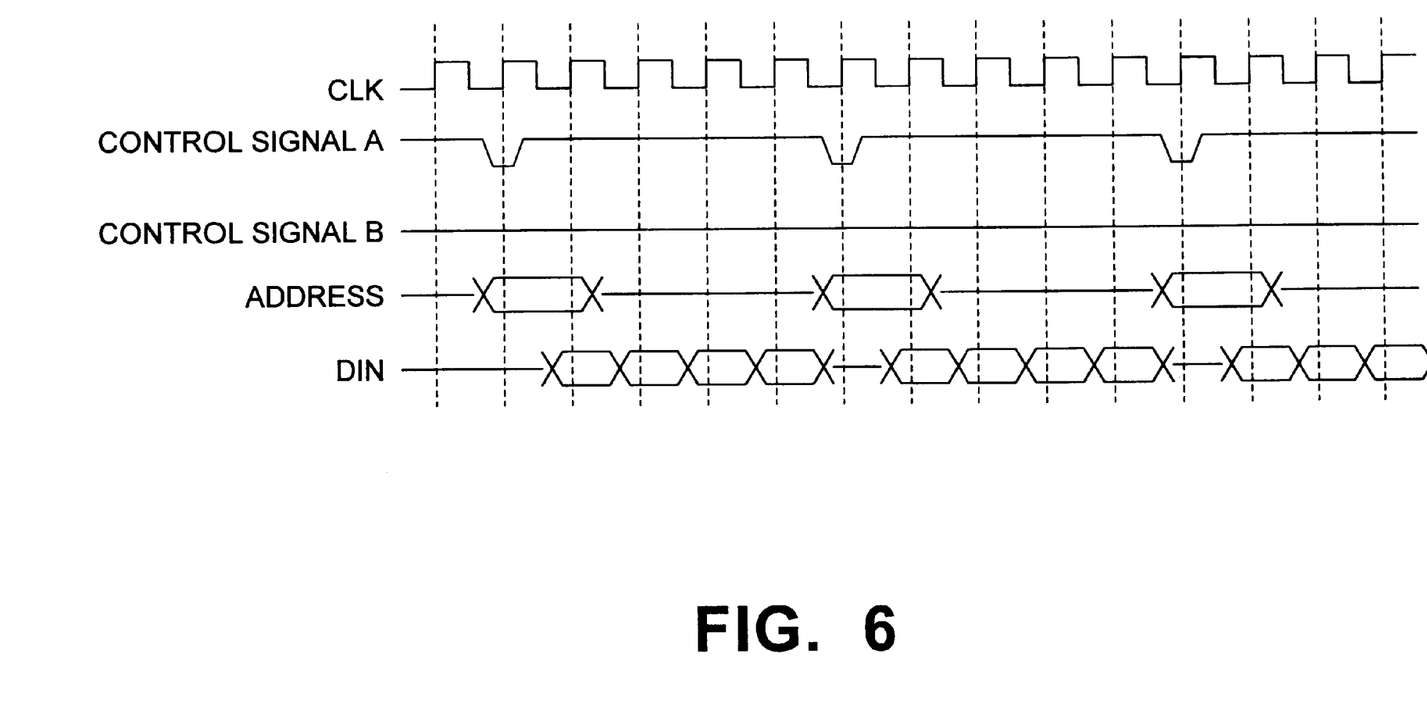
FIG. 6 is a timing chart at the time when five-cycle write operation is continuously performed in the first embodiment of the present invention.

The method of burn-in testing of the present invention is performed by latching the control signal 14 into the counter 7, inputting a signal, which delays the decode timing, to the register 5 and burst counter 10, and delaying the decode timing of the decoder 11 by one cycle by the burst counter 10. FIG. 6 shows timing in the case of continuously performing the four-cycle write operation.

Therefore, with noting that in this embodiment, only the write operation performs at the time of performing the BT, the operation of the burst counter 10 is controlled only at the time of performing the BT so that the decode timing of the decoder 11 may be delayed by one cycle. Therefore, it is possible to shorten the BT time by substantially omitting the late write cycle (P3 period).

Furthermore, effects in the first embodiment of the present invention will be concretely described with comparison to the conventional example shown in FIG. 1. If the data in a write state is inputted from the decision circuit 3, the counter 7 shown in FIG. 1 can input a next burst start signal to the counter 10 only after six-cycle operation including the late write cycle is completed. It is because the write operation requires six cycles that is composed of the late write cycle (one cycle), an input cycle of the data input signal DIN (four cycles), and a digit line precharge cycle after the write operation that is unique in an SRAM memory cell (one cycle).

In FIG. 3, the operation cycle of a signal, which is transmitted from the register 4, which latches the data input signal DIN, through the write circuit 9 to the memory cell 12, and a signal which is transmitted from the register 5, which latches the address input signal, and the burst counter 10, which latches the address input signal, through the decoder 11 to the memory cell 12 is earlier by one cycle than a cycle in which the data input signal DIN is transmitted to the memory cell 12. Therefore, the burst counter 10 performs the operation of delaying the decode timing of the decoder 11 by one cycle.

With using concrete values, effects by the first embodiment of the present invention will be described. Continuous operation of the write operation that has the burst length of four normally requires six cycles. Therefore, in the case of a 64K (14 bits×2 (burst length: 4) bits) device, the BT time can be obtained from the following formula (1).

$$\text{BT time}=14 \text{ bits } (16384) \times 6 \text{ cycles} \times \text{BT rate} \quad (1)$$

According to this embodiment, six cycles are reduced to five cycles by omitting the late write cycle, and hence the BT time can be obtained from the following formula (2).

$$\text{BT time}=14 \text{ bits } (16384) \times 5 \text{ cycles} \times \text{BT rate} \quad (2)$$

Therefore, the BT time is shorten to ⅚ of the conventional BT time.

In the first embodiment described above, it is delayed by one cycle to transmit the burst start signal to the counter 10 in the counter 7 in the write state in response to data transmitted from the decision circuit 3 in which only the write state exists at the time of performing the BT.

Nevertheless, instead of this method, it can be also performed to substantially delay the decode timing of the decoder 11 by one cycle in the burst counter 10 by making transmission of the burst start signal earlier by one cycle than that in the ordinary operation with the control signal 14 which is generated only at the time of performing the BT, and latching a next burst start signal after five cycles of the write operation are completed, and to synchronize the decode timing with an input cycle of the data input signal DIN to omit the late write cycle.

Next, a second embodiment of the present invention will be described. Since only the write operation is performed in a BT, it can be also performed to shorten BT time by omitting a precharge cycle of a memory cell 12 that is necessary for read operation after the write operation in an SRAM synchronous semiconductor memory device.

To be concrete, the control unit 7 latches a next burst start signal into the decoder 8 and 10 in response to the control signal 14 that is forcibly inputted when write operation to the memory cell 12 with a data input signal is completed. Owing to this, it becomes possible to omit the precharge cycle.

In this case, in the burn-in test for the semiconductor memory device, at the point when the write operation to the memory cell by the data input signal is completed, the control unit 7 latches a next burst start signal and precharges the digit line of the memory cell 12 during the write operation.

Furthermore, the control unit 7 forcibly inputs the control signal 14, and thereafter delays the operation cycle of the decode timing by the decoder 8 and 11 to the operation cycle of a write command signal of the write circuit 4 and 9, which is transmitted to the memory cell 12, in response to the control signal 14. Moreover, at the point when the write operation to the memory cell 12 by the data input signal DIN is completed, the control unit 7 latches a next burst start signal in response to the control signal 14 which is forcibly inputted, and precharges the digit line of the memory cell 12 during the write operation. According to this method, the late write cycle is reduced from 5 cycles to 4 cycles.

Therefore, the BT time is obtained from the following formula (3).

$$\text{BT time} = 14 \text{ bits } (16384) \times 4 \text{ cycles} \times \text{BT rate} \quad (3)$$

Figure 7:
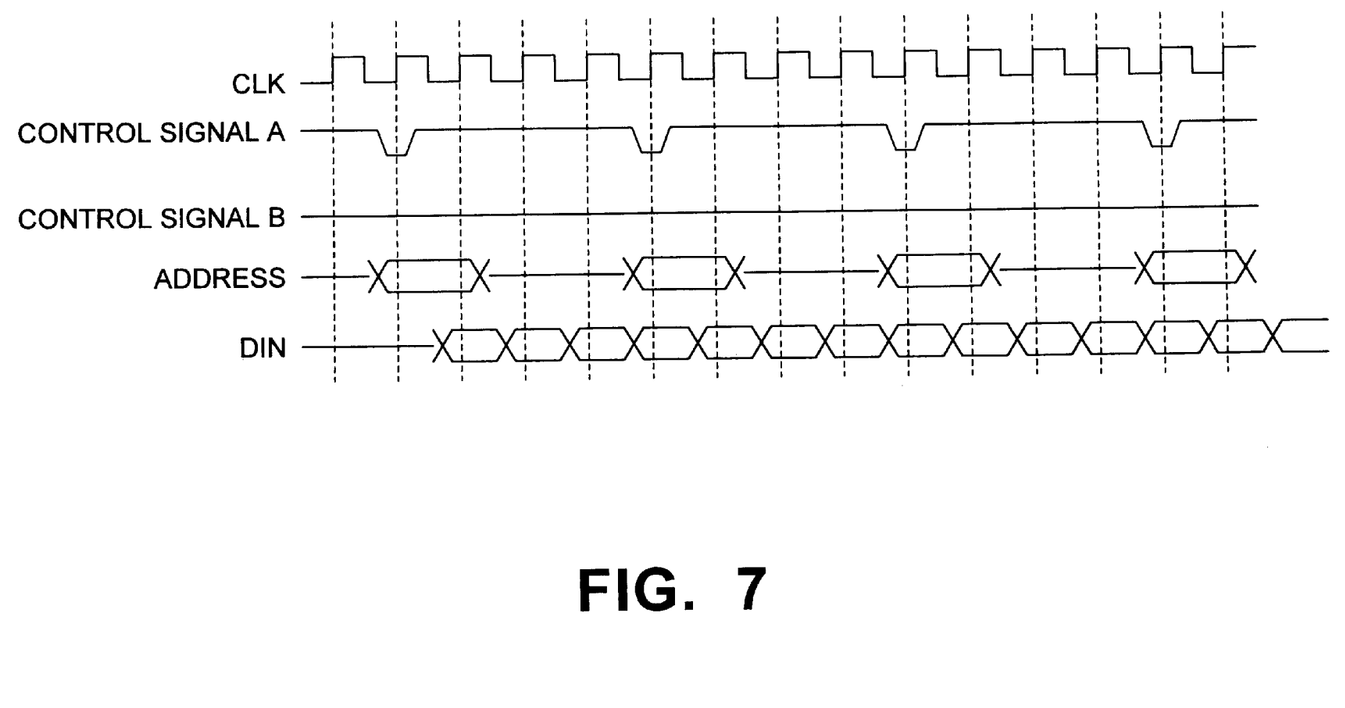
FIG. 7 is a timing chart at the time when four-cycle write operation is continuously performed in another embodiment of the present invention.

Owing to this, the BT time is shorten to 4/5 of the conventional BT time. FIG. 7 shows timing at the time when four-cycle write operation is continuously performed.

As described above, according to the present invention, it is possible to reduce a write cycle by reducing the late write cycle at the time of performing the BT.

What is claimed is:

1. A semiconductor memory device having a memory cell comprising:
   a write circuit which outputs a write command to the memory cell in response to the data input signal;
   a decoder which decodes an address command to the memory cell; and
   a control unit which outputs to the decoder, a signal delaying decode timing in response to a control signal input only at the time of performing a burn-in test,
   wherein said write command and said address command delayed by said signal are output to said memory cell simultaneously.

2. A semiconductor memory device, having a memory cell comprising:
   a write circuit which outputs a write command to the memory cell in response to the data input signal;
   a decoder which decodes an address command to the memory cell; and
   a control unit which outputs to the decoder, the signal delaying decode timing in response to a control signal inputted at the time of performing a burn-in test,
   wherein the control unit delays an operation cycle of the decode timing by one cycle to an operation cycle of a write command signal transmitted from the write circuit to the memory cell.

3. A semiconductor memory device, having a memory cell comprising:
   a write circuit which outputs a write command to the memory cell in response to the data input signal;
   a decoder which decodes an address command to the memory cell; and
   a control unit which outputs to the decoder, the signal delaying decode timing in response to a control signal inputted at the time of performing a burn-in test,
   wherein the control unit latches a next burst start signal into the decoder in response to a control signal forcibly inputted when write operation to a memory cell by a data input signal is completed.

4. A method of burn-in testing for performing a test concerned with reliability for a semiconductor memory device by inputting a data input signal to a memory cell and outputting a data output signal from the memory cell, the method of burn-in testing comprising:
   inputting a control signal forcibly;
   delaying an operation cycle of decode timing by a decoder in response to the control signal to an operation cycle of a write command signal which is transmitted to the memory cell; and
   outputting simultaneously said write command and an address command from said decoder to said memory cell.

5. A method of burn-in testing for performing a test concerned with reliability for a semiconductor memory device by inputting a data input signal to a memory cell and outputting a data output signal from the memory cell, the method of burn-in testing comprising the steps of:
   inputting a control signal forcibly; and
   delaying an operation cycle of decode timing by one cycle in response to the control signal to an operation cycle of a write command signal which is transmitted to the memory cell.

6. A method of burn-in testing for performing a test concerned with reliability for a semiconductor memory device by inputting a data input signal to a memory cell and outputting a data output signal from the memory cell, the method of burn-in testing comprising the steps of:
   latching a next burst start signal in response to a control signal forcibly inputted when write operation to the memory cell by the data input signal is completed; and
   precharging a digit line of the memory cell during write operation to said memory cell.

7. A method of burn-in testing for performing a test concerned with reliability for a semiconductor memory device by inputting a data input signal to a memory cell and outputting a data output signal from the memory cell, the method of burn-in testing comprising the steps of:
   inputting a control signal forcibly;
   delaying an operation cycle of decode timing by a decoder in response to the control signal to an operation cycle of a write command signal which is transmitted to the memory cell;
   latching a next burst start signal in response to a control signal forcibly inputted when write operation to the memory cell by the data input signal is completed; and
   precharging a digit line of the memory cell during write operation to said memory cell.

8. A semiconductor memory device as claimed in claim 2, wherein the control unit latches a next burst start signal into the decoder in response to a control signal forcibly inputted when a write operation to a memory cell by a data input signal is completed.

* * * * *